METHOD OF AND TOOLS FOR MAKING PRINTED CIRCUIT BOARDS

Filed Nov. 29, 1963 3 Sheets-Sheet 1

INVENTORS
R. E. KLEIN
J. E. DRIVER
BY
ATTORNEY

United States Patent Office 3,375,576
Patented Apr. 2, 1968

3,375,576
METHOD OF AND TOOLS FOR MAKING PRINTED CIRCUIT BOARDS

Robert E. Klein and James E. Driver, Sr., Fort Wayne, Ind., assignors to International Telephone and Telegraph Corporation, New York, N.Y., a corporation of Maryland Filed Nov. 29, 1963, Ser. No. 327,130
12 Claims. (Cl. 29—626)

This invention relates to electronic component modules and more particularly to methods of and tools for making printed circuit boards especially—although not exclusively—for use in cordwood modules.

Heretofore, electronic circuitry has progressed from hand wired chassis through printed wiring to module construction. With these structural changes, engineering techniques have also changed from individual component-to-component design through logic design to automated design. Design automation programs utilize computers for selecting circuit stages and components according to performance requirements. These stages and components are generally pre-formed as modules which may be plugged together in a great variety of options.

This design automation process has generated a need for a wide variety of standard circuit modules. To be of greatest value, these modules should be of the miniature or subminiature, plug-in type, extremely reliable in operation and economical to build. In meeting the miniaturization requirement, printed circuit boards have been utilized to provide wiring between and a sturdy support for the module components. However, problems are sometimes encountered when soldering the components to the printed wiring. For example, in sub-miniaturized modules, the spaces between etched conductors become very small, and this requires critical quality control. This problem of conductor spacing has been solved by providing tab terminals integral with the printed wiring and then welding the components to the terminals. However, this solution has not been entirely adequate since the tabs have been relatively expensive to form. Another problem encountered in fabricating sub-miniaturized modules is minimizing the space required to provide connections between the module units and the plug-in terminals mounted on the module housing. This problem has also been solved by the expedient of soldering or welding terminals directly to proper portions of the module printed circuit board. This, in turn, introduces greater fabrication expenses.

The above solutions to the packaging problems have resulted in reliable and compact modules. But these modules have the disadvantage that the many manufacturing steps necessary to provide the printed wiring board with suitable welding tabs and plug-in terminals become quite costly and make potential sources of circuit failure.

Therefore, an object of this invention is to provide new and improved methods of and tools for making printed wiring modules. Another object is to provide printed circuit boards having tab terminals suitable for welding together electronic components and plug-in terminals. Yet another object is to provide printed circuit boards which can be economically fabricated without loss of either compactness or reliability. A related object of this invention is to provide more economical and reliable methods of manufacturing module units and components therefor.

According to one aspect of the present invention, printed circuit boards are formed by first etching an unpunched base board of insulating material covered with a conductive material. This etching forms the printed wiring. Then the etched board is placed in a tool and die set which simultaneously punches apertures in the board and bends up tab terminals of the conductive material. At the same time, other tabs of the conductive material may also be bent to form external plug-in terminals. Finally, components are welded to desired ones of the tab terminals.

In accordance with another aspect of the invention, the tool and die set may be viewed as a two-step, self-forming tool for making a tab and aperture in a lamina of at least two dissimilar materials. For example, when the tool and die are used to manufacture a printed circuit board, the lamina is made-up of the insulating baseboard and the metal foil; however, the tool and die are not limited to use with this particular material. The important feature is that a first of the lamina materials has physical characteristics which make it more pliable than the other of the lamina materials. The other material has a shear strength which is much greater than the shear strength of the first material. Thus, the first material extrudes when subjected to a given force, which is adequate to shear the other material. The die has an aperture with a continuous wall. Part of the wall terminates at a cutting edge and the remainder of the wall terminates at a bending edge. A punch has an edge adjacent the cutting edge of the aperture shaped so that the punch and the aperture form a pair of cooperating shearing edges. The edge of the punch adjacent the bending edge is shaped to bend a tab of the shear material which is then pushed down to form a shim liner inside the aperture. This shim covers the bending edge and acts with the adjacent edge of the punch to form a pair of cooperating shearing edges. The punch and die now form a tool for punching a hole through the pliable material.

The above mentioned and other features of this invention and the manner of obtaining them will become more apparent, and the invention itself will be best understood by reference to the following description of an embodiment of the invention taken in conjunction with the accompanying drawings, in which.

In its broadest form, the invention relates to methods of and tools for fabrication when it is necessary to work on a lamina of dissimilar materials. Those skilled in the are will readily perceive how these methods and tools may be used to build many different structures. However, to provide a concrete example of one such structure, this specification now turns to a description of how to build a module of electronic components.

Figure 1:
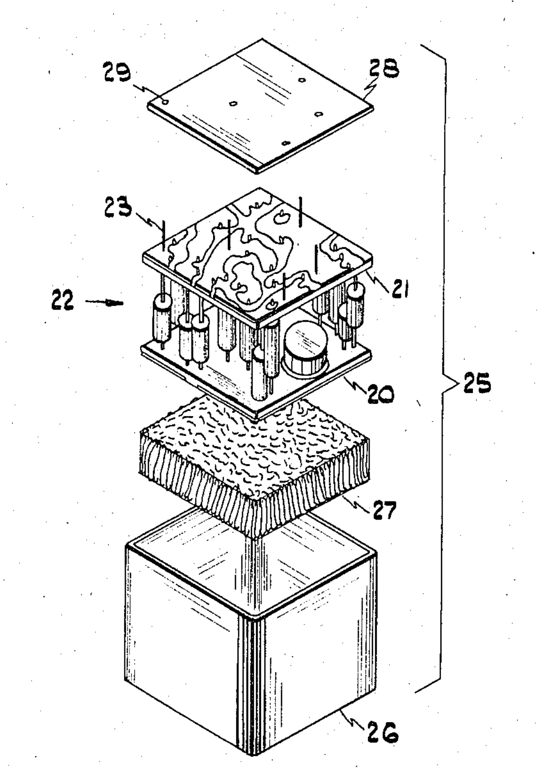
FIG. 1 is a exploded view which shows how a module may be made according to the invention.

The manner of assembling this module should be apparent from an inspection of FIG. 1 where two printed circuit boards 20, 21 are positioned in spaced parallel relation. Any suitable number of electronic components 22 are supported between these boards since the leads on the components pass through holes in the boards. These leads are then soldered or welded into position on the boards. Conventionally, this type of arrangement is called a "welded cordwood module."

External tabs, prongs, or lugs may be provided on the module for making plug-jack connections with other circuits, as shown at 23. Or other suitable means may be provided for making external connections, such as a cable of wires, for example.

After the welded cordwood module is completed, an assembly 25 is put together to make a completely enclosed—preferably hermetically sealed—housing. This assembly 25 comprises a can or cover 26 which may be either extruded or drawn to form a desired cup shape of thin sheet metal. Next a shock absorbing material (such as a pad of plastic foam or other suitable material) 27 is placed in the bottom of the can 26. Then, the cordwood module 20–23 is placed in the can on top of the pad 27. Thereafter, a potting compound may be poured into the can to fill all unused space and to provide the desired hermetic seal. Finally, a header or cover plate 28 is attached to cover the mouth of can 26 and complete the enclosure. This header has one or more holes (such as 29) through which the terminals (such as 23) may pass. Alternatively, the cover may have a single opening through which any desired number of leads may pass.

Figures 2, 3:
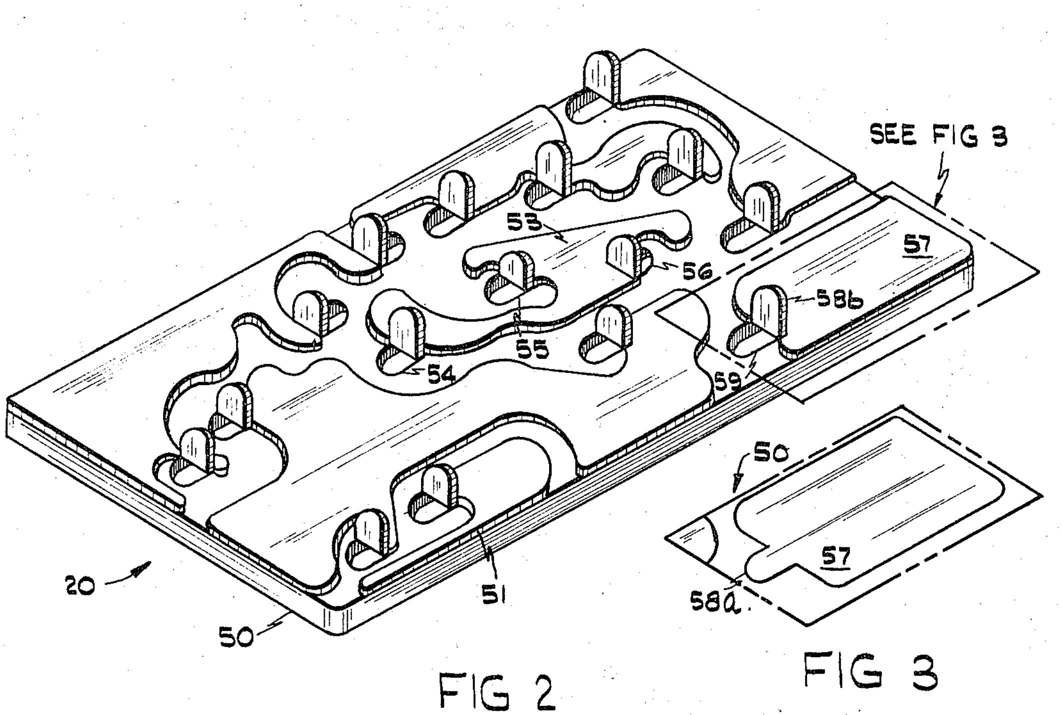
FIG. 2 is a perspective view of a printed circuit board formed according to the teaching of this invention.
FIG. 3 is a view of a portion of the FIG. 2 board before a terminal tab is formed therein.

The details about the construction of the printed circuit boards may become more apparent from a study of FIG. 2. Here we show the board 20 as it appears after it is manufactured according to the teachings of the invention and before any components are mounted on it. As is conventional, this board 20 comprises a baseboard of insulating material 50 for supporting a metal foil 51. Initially, this foil is a solid sheet of electrically conductive material. Then certain unwanted parts of the foil are etched away by any known process to leave pieces of the foil in desired geometrical shapes. Each piece comprises a conductor extending between desired contact points. For example, the piece of foil 53 extends between the three contact points 54–56. In like manner, other pieces of foil extend between other contact points.

Preferably, tab shaped sections are pre-formed on the foil during the etching process. These pre-formed shapes are the beginnings of tab terminals which are yet to be formed. Thus, as shown in FIG. 3, the piece of foil 57 is provided with a tab shaped section **58*a* which is still bonded to the board 50, just as all of the other pieces of foil 51 are also still bonded to the board. Later, during the manufacturing process, this pre-formed tab section is separated from the insulating base material 50 and then bent upward to form the tab terminal 58*b* (FIG. 2). Simultaneously with the bending of this tab, an aperture 59 is formed in the insulating material of board 50**. In like manner an aperture and tab terminal are formed simultaneously at every contact point.

Figure 4:
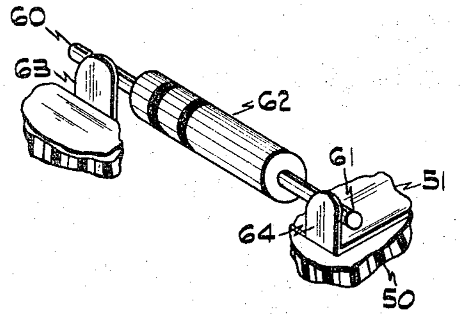
FIG. 4 shows one manner in which electronic components may be welded to the tab terminals of the FIG. 2 printed circuit board.
Figure 5:
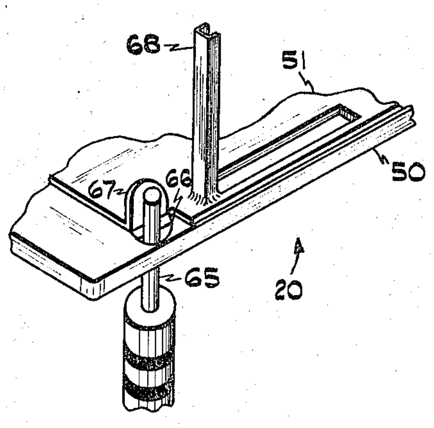
FIG. 5 shows an alternative way of welding components to the tab terminals and also a way of forming a plug for making terminal base connectors.

The electronic components may be joined to these tab terminals by any suitable process including soldering, or wire wrapping; however, the preferred embodiment of the invention utilizes welding techniques of a type pioneered in the processes developed to manufacture sub-miniature vacuum tubes. In one embodiment, the components are mounted on a single side of a single printed board. For example, as shown in FIG. 4, the leads 60, 61 of component 62 are welded to tab terminals 63, 64. In another embodiment, each of the components is mounted perpendicularly to the board 20. To do this, one of the component leads is passed through an aperture in the board; then it is welded to a tab terminal adjacent the aperture. For example, FIG. 5 shows the lead 65 as passing through the aperture 66 where it is welded to the tab terminal 67. A combination of these techniques are used to manufacture the cordwood module of FIG. 1 where some components are mounted on a single side of the board 20, and other components are suspended between the boards 20, 21.

To provide a terminal base connector for connecting the module to external electrical circuits, many different procedures may be followed. According to one procedure, entirely conventional printed circuit board connectors are used. According to another procedure, some of the component leads, such as 65, are not cut off flush with the tab terminal, but are allowed to extend outwardly from the printed circuit board for a distance adequate to provide either solder or plug-in terminals. According to yet another procedure, an extra long tab terminal 68 is bent up from the conductive metal foil 51. To provide added strength, these long tab terminals are given some added degree of cross section thickness. For example, the long tab 68 is shown as bent to form a somewhat rectangular cross section. It could also be given a somewhat semicircular or other suitable cross section. These long tabs provide terminals for making solder, wire-wrap, or plug-in connections. If plug-in types of terminals are provided, they should be geometrically arranged so that they will fit into a desired socket base, such as a sub-miniature tube socket.

Figure 6:
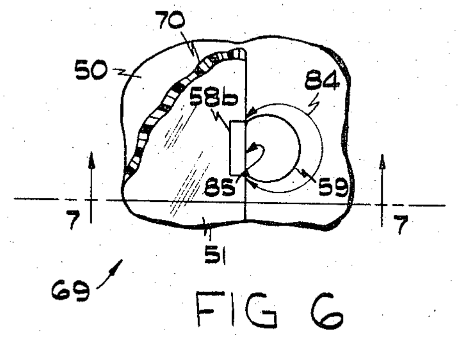
FIG. 6 is a top plan view showing a fragment of a printed circuit board having a tab terminal of the conductive material formed thereon.
Figure 7:
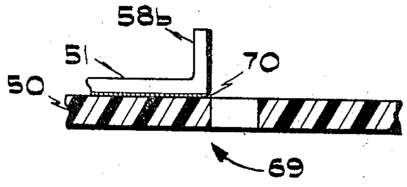
FIG. 7 is a side elevation cross-section view taken along line 7—7 of FIG. 6.

A section of printed circuit board having an exemplary tab terminal is shown in FIGS. 6, 7. As should be apparent by an inspection of these figures, the tab **58*b* is formed on a sandwich 69 of materials which we call a lamina of dissimilar materials. A first of these materials 05 is the insulating board which supports the second material which is the metal foil 51. The third material 70, which best appears in FIG. 7, symbolically represents the attraction or bonding forces which bond the materials 50 and 51 together. These bonding forces may be thought of as an adhesive such as cement, heat seals, or as any other bonding. In one exemplary construction, the layer 70** was an epoxy with a pull strength of 5 to 10 pounds per square inch.

The first material 50, which we call the "pliable material," has physical characteristics which make it more pliable than the second material 51. In the exemplary construction, the pliable material was "Mylar," per Mil. Spec. 1–631, having a thickness of .016±.002 inch. The shear strength of the second material 51, which we call the "shear material," is greater than the shear strength of the pliable material. In the exemplary construction, the shear material was .007 inch thick and met a Federal Specification for grade "A," 99% nickel.

It should be recognized that the layer 70 could theoretically represent a continuum of bonding forces extending from zero to infinity. At one extreme, the shear material 51 could simply lay upon the pliable material 50 with no bonding force between them. At the other extreme, the shear material could be alloyed with the pliable material so that the attractive forces approached infinity. In the practice of this invention, the useful range of these forces lies in the area where the bond between the materials 50, 51 break when the lamina is subjected to a shearing force great enough to shear the shear material but not yet great enough to shear the pliable material.

Figure 8:
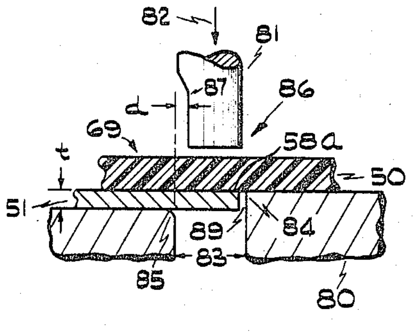
FIGS. 8–10 show a sequence of steps followed during a practice of the invention.
Figure 9:
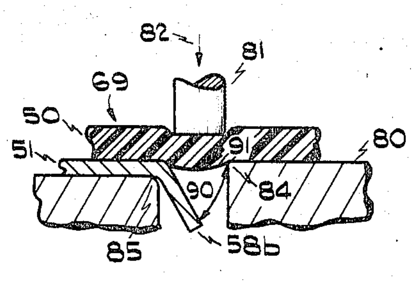
Figure 10:
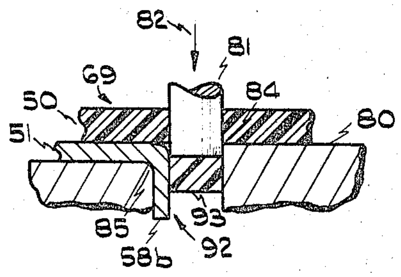

With this background of structural information in mind, the reader will better understand how to practice the invention when he studies the sequence of events depicted in FIGS. 8–10. Here the tool for fabricating the tab terminal is shown as a die 80 and a punch 81. The shearing force is symbolically represented by an arrow 82.

The die 80 comprises a block (which may be steel) with an aperture 83 having a continuous inner wall which closes upon itself. As shown in FIG. 6, this wall is preferably shaped to provide a hole which is somewhat D-shaped. A portion of this wall terminates at a cutting edge, as shown at 84. The remainder 85 of this wall terminates at a bending edge. The bending edge preferably has a radius of curvature which is equal to or greater than the thickness $t$ of the metal foil 51.

The punch 81 is positioned above and in cutting relationship with the aperture 83. The contour of the punch is complementary to the contour of the aperture. Thus, the round side 86 of a generally D-shape cross section of the punch has a cutting edge and the flat side 87 of the D-shape cooperates with the bending edge 85. The distance *d* between punch edge 87 and the bending aperture edge 85 is approximately equal to the foil thickness *t*. Upon reflection, it should be clear that the punch and aperture edges 84, 86 cooperate to form a pair of shearing edges. The edges 85, 87 cooperate to form a pair of bending edges.

To practice the invention, the lamina 69 is placed between the punch 81 and the die 80 (FIG. 8). Preferably, there is a related jig (not shown) which properly positions the lamina with respect to the die. When so positioned the unbent tab section 58*a* extends partially across the width of the aperture 83, leaving a small space 89 where the foil does not appear within the aperture 83. It should be noted that the foil now extends from a point beyond the aperture, over the bending edge 85, and toward, but not to, the shearing edge 84.

The first step in the punching process occurs when the punch 81 is closed toward the die by being lowered onto the lamina with a force which begins to deform the pliable material 50. This material does not immediately tear, but begins to extrude into the aperture 83. As the punch begins to penetrate the pliable material, it begins to stretch. This stretching of the material 50 exerts a pulling force upon the bond 70 between the pliable material 50 and the shear material 51. An important aspect of the invention is that the shear material should at least begin to break away from the pliable material (as shown at 90) before the pliable material begins to tear.

As the pliable material continues to extrude into the aperture 83, it forms a dish shape, as shown at 91. The tab terminal 58*b*, which has snapped loose from the pliable material, begins to bend without tearing because of the radius of curvature 85 and because the dish shape 91 of the ductile material applies a uniform non-shearing pressure over the entire area of the shear material which is wrapping around the bending edge 85. Also, the elasticity of the pliable material acts somewhat as a shock absorber to reduce any shearing forces which might otherwise tend to tear the shear material.

The second step in the punching process occurs when the pliable material 50 begins to form a plunger. The plunger presses the tab 58*b* against the inner surface of the aperture 83. As the tab bends, it forms itself into a shim lining the aperture and filling the space *d* between the side 87 of the punch and the bending edge 85 of the aperture. The shim now covers the bending edge and occupies the space into which the ductile material is trying to flow. This causes the ductile material to tear and form a plug 93. As the punch forces the plug 93 through the aperture 83 the tab 58 is smoothed against the wall of the aperture. This forms the upstanding tab terminal, thus completing the two-step punching process.

Figure 11:
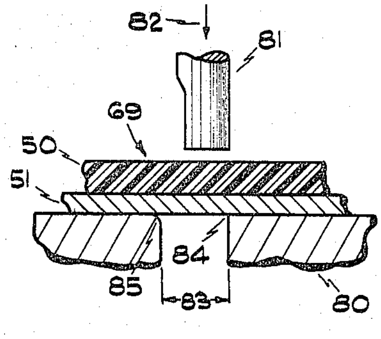
FIGS. 11 and 12 show an alternative sequence of events.
Figure 12:
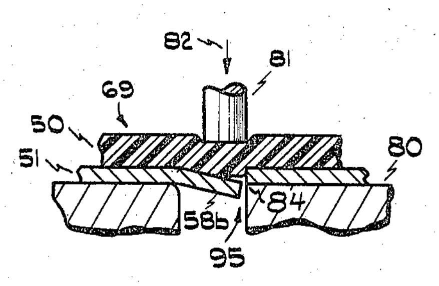

In another embodiment of the invention, FIGS. 11, 12, the tabs are not pre-formed during the etching process, as taught by FIG. 3. Instead, the foil 51 initially extends entirely across the mouth of aperture 83, as shown in FIG. 11. In FIG. 12, the punch 81 is closed toward the die which shears the tab by causing it to tear against the edge 84. Before the tab is sheared out of the foil, the dish 91 cannot appear because the unbroken foil covers the entire mouth of the aperture 83. After the shear material 51 is cut as shown in FIG. 12, the dish 91 does appear and the tab is formed in the manner shown by FIGS. 8–10.

Figure 13:
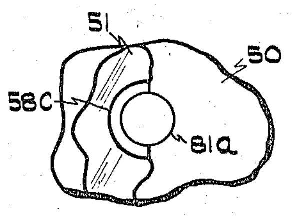
FIGS. 13 and 14 show various punch shape modifications for making alternative shapes for the cross-sections of the tabs.
Figure 14:
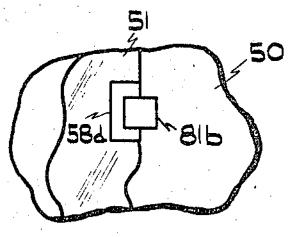

In yet another embodiment of the invention, the punch and aperture are not D-shaped and the finished tab terminal is not flat in cross section. Instead, as shown at 81*a* (FIG. 13), the punch may form a somewhat semicircular cross section in the tab terminal 58*c*. Or, as shown at 81*b* (FIG. 14), the punch may form a somewhat rectangular cross section in the tab terminal 58*d*. Of course, other cross section shapes may also be provided. The object of the FIGS. 13, 14 punchings is to add mechanical strength by increasing the rigidity of the tab terminal. This is how the long tab terminal 68 (FIG. 5) is formed.

In the exemplary construction, the International Telephone and Telegraph Corporation had very good results with the described "Mylar" and nickel lamina bonded together by an epoxy. The die 80 was simply a block of steel with holes drilled at selected locations to form a number of apertures, such as 83. One edge of each hole was then rounded, as by filing, to provide the bending edge 85. The punches 81 were made from readily available steel rod stock having approximately the same diameter as the holes. The stock rod was first cut into a number of short lengths. Then one side of each short length was ground away to provide the distance *d* between the punch and the bending edge 85. Thereafter, each of the short lengths was secured in a header with the ground side of each rod positioned adjacent the rounded, bending edge of the associated die aperture.

For the precision required in printed circuit work, it was found that there were no extremely close tolerance requirements for the punch and die. The relationships which were judged to be the most important for design considerations were the differences between the pliability and shear strength of the two materials in the lamina, and the force used to drive the punch through the lamina. The simplest statement about these relationships is that the pliability of the plastic should be such that it forms the dish 91 under a pressure adequate to shear the foil.

While the principles of the invention have been described above in connection with specific apparatus and applications, it is to be understood that this description is made only by way of example and not as a limitation on the scope of the invention.

We claim:

1. A method of manufacture comprising the steps of forming a lamina of pliable and shear materials bonded together by bonding forces having a given pull strength, punching at least one hole in said lamina by exerting forces against said ductile material great enough to stretch said ductile material into a dish shape, said pull strength being such that said shear material breaks away from said pliable material when said ductile material is stretched, and bending said shear material to an upstanding position while tearing said pliable material during the punching step, whereby said lamina is formed into at least one hole having a tab terminal upstanding beside the hole.

2. A method of manufacture comprising the steps of forming a lamina of pliable and shear materials bonded together by bonding forces having a given pull strength, placing said lamina between a punch and a die having a shearing edge and a bending edge, said pliable material being next to said punch, closing said punch against said lamina to exert forces said pliable material great enough to force said ductile material into the mouth of said die thereby forming a dish shaped plunger, said pull strength being such that said bond snaps and said shear material breaks away from said pliable material when said pliable material is stretched into said dish shape, the continued closing of said punch forcing said plunger through said die for bending said shear material against the wall of said die to form a shim between the punch and die and to form an upstanding tab terminal, and shearing said pliable material between said shimmed die and said punch, whereby said lamina is formed into a hole having a tab terminal upstanding beside the hole.

3. The method of claim 2 and the step of pre-forming said shear material into a tab section whereby said tab section has a tab terminal shape when said lamina is placed between said punch and die.

4. The method of claim 2 and the step of shearing said sheer metal between said punch and die to form a tab terminal shape before said bond snaps.

5. The method of claim 2 and the step of effectively adding cross sectional strength to said tab terminal by causing said plunger to smooth said tab against a non-flat wall of said die.

6. The method of claim 5 wherein said plunger and said non-flat wall cooperate to make said cross section somewhat semi-circular.

7. The method of claim 5 wherein said plunger and said non-flat wall cooperate to make said cross section somewhat rectangular.

8. A method of making cordwood modules comprising the steps of forming printed circuit boards from laminas of pliable and shear materials bonded together by forces having a given pull strength, punching a plurality of holes in said laminas by exerting forces against a plurality of points on said pliable material, said exerted forces being great enough to stretch said ductile material into a dish shaped plunger at each of said points, said pull strength being such that said shear material parts from said pliable material to form a tab at each of said points where said pliable material is stretched, bending each tab of said shear material simultaneously while punching said pliable material, whereby said lamina is formed to provide a plurality of holes, each having an associated tab terminal upstanding thereby, suspending at least one electronic component between a spaced parallel pair of said boards by passing component leads through an associated set of said holes, and welding said leads to the upstanding tab terminals adjacent said set of holes.

9. The method of claim 8 and the step of forming certain of said tab terminals into extra long terminals for making external connections from said module to other circuits.

10. The module of claim 9 and the step of shaping said long tab terminals to provide extra mechanical strength.

11. The module of claim 8 and the steps of shock mounting said module in a can, and closing said can to provide a hermetically sealed unit.

12. A manufacturing process utilizing a self-forming tool and die for manufacturing modules of electronic components, said die comprising an aperture with a continuous wall, at least a portion of said wall being terminated at a shearing edge and the remainder of said wall being terminated at a bending edge, a punch having contours which are complementary to the contours of said aperture, whereby a material forms a tab when cut by said punch acting in conjunction with said die, said tab covering said bending edge and forming a shim liner positioned between said punch and said wall, means whereby the edges of said tab and said punch cooperated to form a shearing edge at said bending edge for completing a continuous shearing edge around the entire wall of said aperture, said process comprising the steps of forming printed circuit boards from a lamina of pliable and shear materials bonded together, positioning said printed circuit boards between said punch and die, closing said punch and die to form holes in said lamina by exerting forces against said pliable material great enough to stretch said ductile material to form a dish shaped plunger at each point where a hole is desired, said shear material breaking away from said pliable material at each point where said pliable material is stretched into said dish shape, bending said shear material to an upstanding position, shearing said pliable material between said bent shear material and said punch, whereby said lamina is formed into a plurality of holes with a tab terminal upstanding beside each hole, removing said punch and thereafter removing said lamina from said die and suspending components between a spaced parallel pair of said printed boards by passing component leads through associated sets of said holes and welding said leads to tabs adjacent said sets of holes.

References Cited

UNITED STATES PATENTS

| | | | |
|---|---|---|---|
| 1,660,387 | 2/1928 | Masel | 83—685 X |
| 1,980,154 | 11/1934 | Coe. | |
| 2,020,408 | 11/1935 | Furth | 113—116 |
| 2,590,807 | 3/1952 | Voslamber | 113—116 X |
| 3,151,278 | 9/1964 | Elarde | 174—68.5 X |

FOREIGN PATENTS

| | | |
|---|---|---|
| 6,357 | 2/1904 | Denmark. |
| 646,314 | 11/1950 | Great Britain. |

JOHN F. CAMPBELL, *Primary Examiner.*

R. W. CHURCH, *Assistant Examiner.*